US008741748B1

(12) United States Patent
Li et al.

(10) Patent No.: US 8,741,748 B1
(45) Date of Patent: Jun. 3, 2014

(54) METHOD TO GROW GROUP III-NITRIDES ON COPPER USING PASSIVATION LAYERS

(71) Applicant: Sandia Corporation, Albuquerque, NM (US)

(72) Inventors: Qiming Li, Albuquerque, NM (US); George T. Wang, Albuquerque, NM (US); Jeffrey T. Figiel, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 13/836,594

(22) Filed: Mar. 15, 2013

(51) Int. Cl.
H01L 21/36 (2006.01)

(52) U.S. Cl.
USPC .......................................................... 438/479

(58) Field of Classification Search
CPC .................................................. H01L 31/1848
USPC .......................................................... 438/479
See application file for complete search history.

(56) References Cited

PUBLICATIONS

Inoue et al. "Epitaxial growth of GaN on copper substrates" Appplied Physics Letters 88, 261910 (2006).*

* cited by examiner

Primary Examiner — Bradley K Smith
(74) Attorney, Agent, or Firm — Kevin W. Bieg

(57) ABSTRACT

Group III-nitride epilayers can be grown directly on copper substrates using intermediate passivation layers. For example, single crystalline c-plane GaN can be grown on Cu (110) substrates with MOCVD. The growth relies on a low temperature AlN passivation layer to isolate any alloying reaction between Ga and Cu.

11 Claims, 3 Drawing Sheets

METHOD TO GROW GROUP III-NITRIDES ON COPPER USING PASSIVATION LAYERS

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to Group III-nitride semiconductor growth and, in particular, to a method to grow Group III-nitrides on copper using passivation layers.

BACKGROUND OF THE INVENTION

Gallium nitride and its aluminum and indium compound semiconductor alloys have been a focus of intense research effort because of their importance in light-emitting, lasing, high-frequency, high mobility, and high-power devices. Due to the lack in availability and high prices of bulk GaN substrates, GaN is typically grown heteroepitaxially on foreign substrates, such as sapphire, SiC, and Si. When these devices are operated in high power conditions, their performance is often limited by the poor electrical and thermal conductivity of the substrates. A widely adopted solution to this problem is to remove or lift off the substrates and bond the thin epilayers on thermally conductive submount materials, such as metal. However, direct growth of GaN on metal substrates would allow more ideal device performance by providing improved heat dissipation and current spreading capability, and avoiding the need for the lift-off and bonding processes. The feasibility of GaN heteroepitaxy on metal has been demonstrated on single crystalline Cu, Mo, Fe, and W substrates. See S. Inoue et al., *Appl. Phys. Lett.* 88, 261910 (2006); K. Okamoto et al., *J. of Cryst. Growth* 311, 1311 (2009); K. Okamoto et al., *Appl. Phys. Lett.* 93, 251906 (2008); and G. Li et al., *Appl. Phys. Lett.* 89, 241905 (2006). The growth technique of these works was pulsed laser deposition at low growth temperatures ranging from 450 to 700° C. In addition, Zhu et al. recently demonstrated the epitaxial growth of GaN on lattice-matched metallic substrates. See Zhu et al., U.S. Pat. Appl. Pub. 2011/0117376. However, this technique required one-axis lattice matching of the c-plane of wurtzite GaN to the (110) crystalline plane of the tungsten substrate and is not generally feasible for other metallic substrates.

Therefore, a need remains for a facile method of Group III-nitride heteroepitaxy on metal substrates using metal-organic chemical vapor deposition (MOCVD), which is the most adopted growth technique for Group III nitride devices in industry and academia.

SUMMARY OF THE INVENTION

The present invention is directed to a method for growing Group III-nitride semiconductor materials on copper substrates using MOCVD because of the superior thermal and electrical conductivity of copper. The method comprises providing a copper substrate; growing a passivation layer on the copper substrate; and growing a Group III-nitride epilayer on the passivation layer.

For example and as described in detail below, copper can be a suitable substrate material for c-plane GaN epitaxy using metal-organic chemical vapor deposition. By using a low temperature AlN passivation layer, Ga and Cu alloying can be prevented so that GaN layer can be grown on Cu at a temperature of 1000° C. As an example, an epitaxial relation of GaN (0001)//Cu(110) was observed using cross-section transmission electron microscopy and electron back scatter diffraction. The single crystalline GaN epilayer shows a threading dislocation density of $3 \times 10^9$ $cm^{-2}$ and strong band edge emission at room temperature. The site alignment between GaN (0001) and Cu(110) shows a mesh ratio of 4/3 and 5/3 in GaN [10-10] and GaN [-1100] directions, which is attributed to the epitaxial relation observed.

BRIEF DESCRIPTION OF THE DRAWINGS

The detailed description will refer to the following drawings, wherein like elements are referred to by like numbers.

DETAILED DESCRIPTION OF THE INVENTION

The present invention is directed to a method for growing Group III-nitride semiconductor materials on copper substrates using MOCVD because of the superior thermal and electrical conductivity of copper. The method comprises providing a copper substrate; growing a passivation layer on the copper substrate; and growing a Group III-nitride epilayer on the passivation layer. The copper substrate can comprise crystalline copper, such as single crystal Cu (110), Cu(100), or Cu(111), or oriented polycrystalline copper. For example, the passivation layer can comprise AlN, SiN, or TiN or compounds thereof with the main function of preventing alloying between the Group III element (e.g., gallium, indium, or aluminum) and copper. For example, the passivation layer can be grown by physical vapor deposition, chemical vapor deposition, metal-organic chemical vapor deposition, sputtering, reactive sputtering, or pulsed laser deposition. Typically, the passivation layer can have a thickness of between about 2 and 50 nm. The Group III-nitride can comprise gallium nitride, indium nitride, aluminum nitride, or their ternary or quaternary alloys. For example, the gallium nitride can comprise single crystalline c-plane GaN. The Group III-nitride epilayer can be grown by metal-organic chemical vapor deposition (MOCVD, also referred to as organometallic vapor phase epitaxy), typically at a temperature between about 500° C. and 1085° C.

As an example of the invention, high purity (99.9999%) polycrystalline Cu squares with a dimension of 10×10×0.5 mm were used as substrates. The surface roughness of these copper substrates was 0.5 nm rms, achieved by chemical and mechanical planarization. The copper substrates were coarsely polycrystalline with crystal grain size ranging from tens to hundreds of microns. The orientations of the copper crystal grains included <100>, <110>, <111>, etc. Therefore, these polycrystalline copper substrates provided a combinatorial approach to investigate epitaxial relationships of GaN on copper. The GaN growth was performed in an MOCVD system with ammonia ($NH_3$), trimethylgallium ($Ga(CH_3)_3$), and trimethylaluminum ($Al(CH_3)_3$) as precursors and $N_2$ and $H_2$ as carrier gases. Two growth strategies were employed. First, a standard 2-step growth technique involving a low temperature GaN buffer layer was used. See S. Nakamura, *Jpn. J. Appl. Phys.* 30, L1705 (1991). Second, instead of using low temperature GaN buffer, an AlN passivation layer was first grown at 800° C. and 150 torr, which was followed by the growth of a 2 μm thick GaN layer at 50 torr and 1000° C. without intentional doping. The epitaxial relation between GaN and the Cu substrate was determined by cross-section transmission electron microscopy (TEM) and electron back scatter diffraction (EBSD) microscopy. The optical properties of the GaN epilayer were investigated by cathodoluminescence (CL) with an electron beam acceleration voltage of 10 kV and current of 3 nA.

Figure 1:
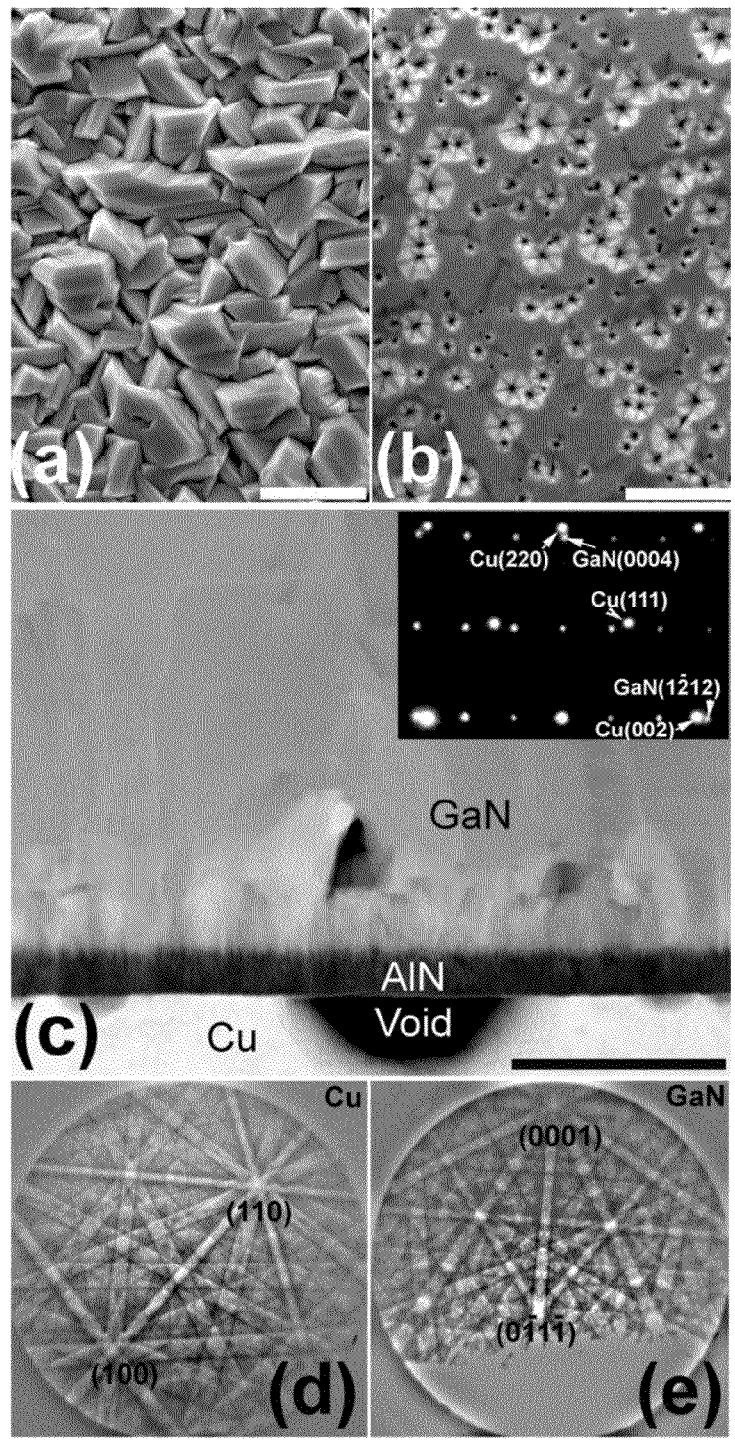
FIGS. 1(a) and 1(b) are SEM images of polycrystalline and single crystalline GaN grown on copper substrates, respectively. The scale bars represent 2 microns.
FIG. 1(c) is a cross-sectional scanning TEM image of the single crystalline GaN grown on Cu with electron diffraction pattern (inset) showing an epitaxy relation of GaN(0001)//Cu(110). The scale bar represents 0.5 micron.
FIGS. 1(d) and 1(e) show EBSD patterns acquired from GaN (0001) epilayer and Cu (110) substrates.

The first growth technique with low temperature GaN passivation layer yielded no GaN epilayers on Cu substrates. The Cu substrate surface is severely pitted. From the Ga-Cu phase diagram, Ga-rich CuGa alloy has a melting temperature much lower than the growth temperature. It is possible that these Ga rich CuGa form during the buffer growth prevent formation of GaN epilayer. The second growth technique with low temperature AlN passivation layer did yield GaN layers on Cu substrates. In this case, two distinct types of surface morphology of GaN layer are observed. The first type is featured by GaN crystal grains orientated in multiple directions as shown in FIG. 1(a), indicating polycrystalline GaN morphology. Cross-sectional TEM samples were prepared from areas like that shown in FIG. 1(a) using selective area focused gallium ion beam milling. The underlying Cu orientation was found to be single crystalline Cu (111). The second type of GaN morphology has regular hexagonal shaped pits as shown in a SEM image in FIG. 1(b). The sides of these pits orientated in the same direction, suggesting a single crystalline c-plane GaN epilayer. Multiple cross-sectional TEM samples were prepared from areas like that shown in FIG. 1(b). A representative z-contrast scanning TEM image is shown in FIG. 1(c). From the TEM image, both AlN passivation layer and the GaN epilayer show a single crystalline texture without grain boundaries. From the electron diffraction pattern (inset of FIG. 1(c)) taken from an area covering epilayer and substrate, (0004) GaN diffraction spot lies along the growth direction with the Cu (220), indicating that the GaN on Cu orientation is GaN (0001)//Cu(110). This result differs from the previously reported epitaxial relationship GaN (0001)//Cu(111) using pulse laser deposition at low growth temperature. See S. Inoue et al., *Appl. Phys. Lett.* 88, 261910 (2006).

The electron diffraction pattern from the copper to GaN has a slight rotation angle, which represents a −1.5° tilt between GaN epilayer and the Cu crystals. This tilt can be described using a Nagai tilt model. See H. Nagai, *J. Appl. Phys.* 45, 3789 (1974). When the lattice constant of the epilayer in the growth direction is larger than that of the substrate, as is the case of GaN on copper, the lattice of the epilayer is strained to equal that of the substrate at the, steps of the substrate. However, the epilayer lattice above the substrate steps has relaxed lattice constant, which is larger than substrate. This difference in lattice constant of the epilayer leads to a tilt. The tilt of the epilayer has been reported in other Group III-nitride materials systems. See X. R Huang et al., *Appl. Phys. Lett.* 86, 211916 (2005); and M. Kryśko et al., *physica status solidi* 4, 142 (2010). In this case: the Nagai tilt between AlN passivation layer and copper is considered. Along the growth direction, c-plane AlN lattice constant is 4.95 A and Cu (110) is 3.61 A. The Nagai tilt is given by $$\alpha = \arctan\left(\frac{\Delta C}{L}\right),$$

where $\Delta C$ and L represent lattice constant difference along growth direction mismatch and in plane surface atomic step width, respectively. if the surface of the Cu(110) grains have miscut angles ranging from 0 to 5 degrees, L can be larger than 40 Å. With $\Delta C$ being 1.34 Å, $\alpha$ ranges from 0 to 1.9 degrees. Therefore, the Nagai tilt model may be obeyed.

The threading dislocation density of the GaN epilayer was estimated from the TEM images. For example, six dislocations are observed in FIG. 1(c). Based on the thickness of the TEM sample (~0.15 μm) as measured by SEM and the imaging size (1.5 μm), the threading dislocation density is estimated to be $\sim 3\times 10^9$ $cm^{-2}$. The voids in GaN epilayer shown in FIG. 1(b) are likely due to the incomplete lateral coalescence of GaN. The voids in Cu near the AlN interface are believed to due to Cu evaporation and out diffusion at high temperature GaN growth stage.

The TEM image in FIG. 1(c) shows only a limited sampling area (1.5×0.15 μm). To unambiguously confirm the GaN crystalline and the Cu substrate orientation, large area e-beam scans (100×60 μm) were performed in order to record an EBSD pattern. The EBSD pattern obtained from GaN epilayers (as shown in FIG. 1(b)) and copper substrates are shown in FIGS. 1(d) and (e), respectively. With EBSD software, pattern bands are detected via a Hough transform. The Hough transform can then be used to enable band detection and relate these locations to the crystal orientation. After three bands are identified, the orientation of the crystal was determined. The analysis of the Kikuchi band patterns confirms the conclusion from the TEM results: the GaN epitaxial relation with Cu is GaN (0001)//Cu(110).

Figure 2:
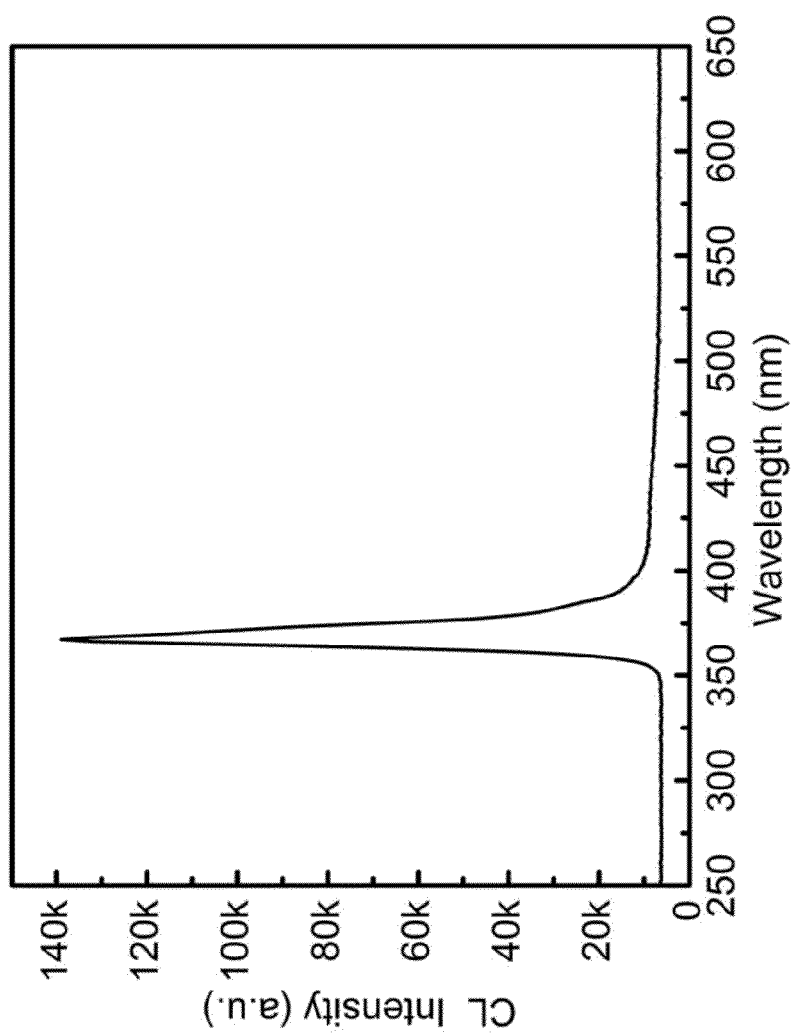
FIG. 2 is a room temperature cathodoluminescence spectrum acquired from single crystalline GaN epilayers on Cu(110).

Room temperature CL measured from the single crystalline GaN epilayer areas is shown in FIG. 2. The peak centered at 366 nm represents GaN band-edge emission. The full width at half maximum (FWHM) of the spectrum is 11 nm, equivalent to that of un-doped GaN epilayer grown on sapphire using the standard 2-step growth technique. See S. Nakamura, *Jpn. J. Appl. Phys.* 30, L1705 (1991). Moreover, it has been suggested that Cu incorporation in GaN can lead to optical transitions at green bands (such as 517 nm) associated with deep Cu induced states. See J. Senawiratne et al., *GaN, AlN, InN and Related Materials* 892, 569 (2006). In this case, no such optical transitions are detected, indicating that the GaN epilayer is not doped with Cu.

Figure 3:
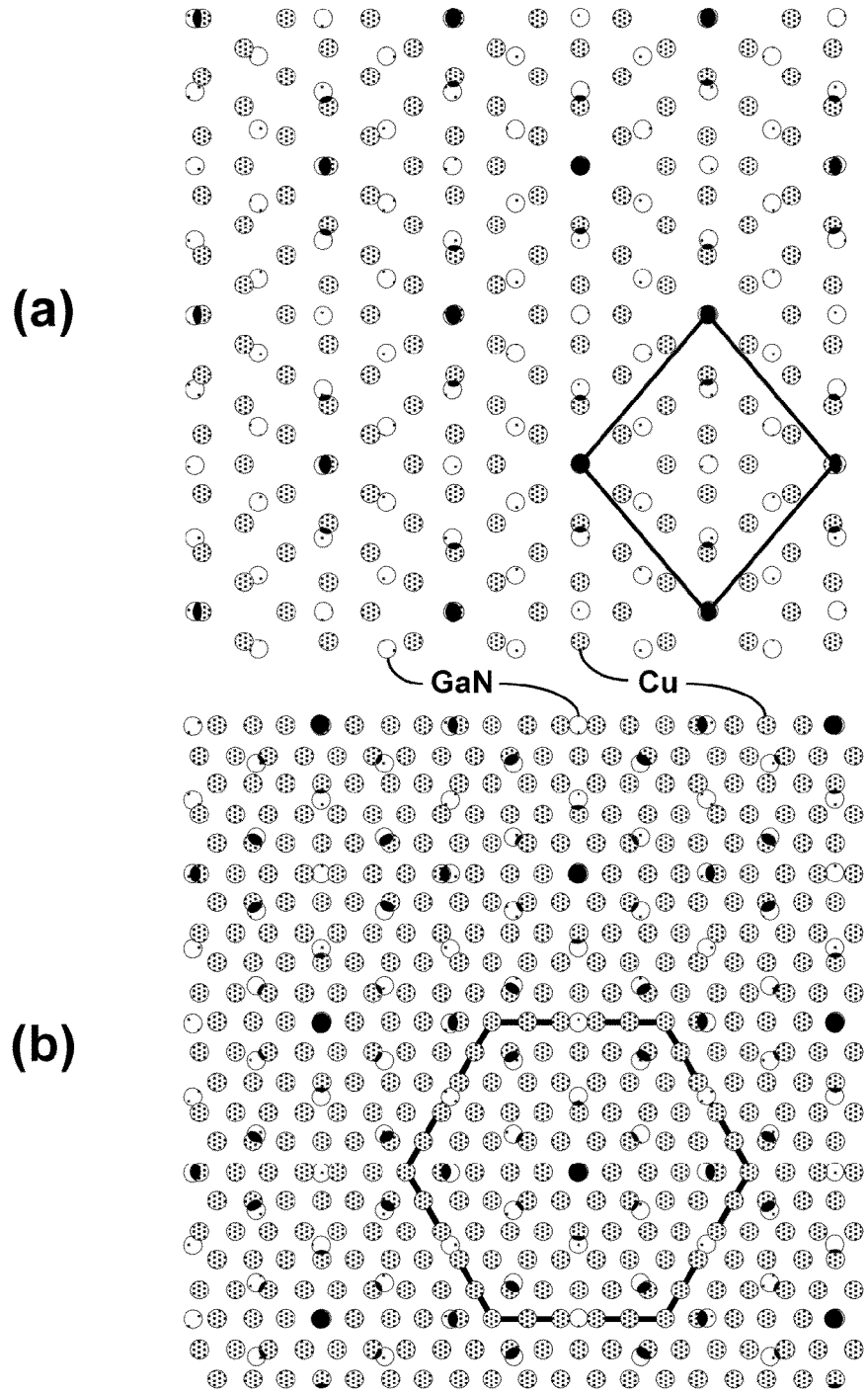
FIG. 3(a) is an illustration of superimposed GaN(0001) (light circles) and Cu(110) (dark circles) lattices.
FIG. 3(b) is an illustration of superimposed GaN(0001) (light circles) and Cu(111) (dark circles) lattices. Black dots represent aligned sites between GaN and Cu. The unit cell of alignment pattern is highlighted for both cases.

A specific relation between the atomic arrangements of the GaN and Cu lattices could explain the heteroepitaxy of GaN (0001) on Cu(110). There exists a set of mesh ratios when the hexagonal GaN (0001) and Cu (110) overlie each other, as shown in FIG. 3(a). Along the direction of Cu[-110] (or GaN 10-10), there exists aligned sites between every sixth row of GaN and every fifth row of Cu sites, i.e. a mesh ratio of 6/5. Along the direction of Cu[001] (or GaN (-1100)), there exists aligned sites between every fifth row of GaN and every third row of Cu sites, i.e. a mesh ration of 5/3. The lattice mismatch that follows from such a mesh relation is +0.4%, low enough to facilitate the observed epitaxial relation between GaN and Cu. As for the case of GaN (0001) on Cu(111), shown in FIG. 3(b), the site alignment is less favorable than GaN (0001) on Cu(110). This can be seen from the density of the aligned sites per unit of surface area. From the size of the alignment unit cells, which are highlighted with solid line in FIG. 3, the aligned site density is 0.71 nm$^{-2}$ and 0.42 nm$^{-2}$ for GaN (0001)//Cu(110) and GaN (0001)//GaN(111), respectively. The low alignment site density for GaN (0001)//GaN(111) may be the reason for observed polycrystalline GaN morphology on GaN (111).

The present invention has been described as a method to grow Group III-nitride on copper using passivation layers. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A method to grow a Group III-nitride on a copper substrate, comprising:
    providing a copper substrate;
    growing a passivation layer on the copper substrate; and
    growing a Group III-nitride epilayer on the passivation layer by metal-organic chemical vapor deposition.

2. The method of claim 1, wherein the copper substrate comprises crystalline copper.

3. The method of claim 2, wherein the crystalline copper comprises single crystal Cu (110), Cu(100), or Cu(111), or oriented polycrystalline copper.

4. The method of claim 1, wherein the passivation layer comprises AlN, SiN, or TiN.

5. The method of claim 1, wherein the step of growing a passivation layer comprises physical vapor deposition, chemical vapor deposition, metal-organic chemical vapor deposition, sputtering, reactive sputtering, or pulsed laser deposition.

6. The method of claim 1, wherein the thickness of the passivation layer is between 2 and 50 nm.

7. The method of claim 1, wherein the Group III-nitride comprises an AlGaInN alloy.

8. The method of claim 7, wherein the AlGaInN alloy comprises GaN.

9. The method of claim 8, wherein the GaN comprises single crystalline c-plane GaN.

10. The method of claim 1, wherein the Group III-nitride epilayer is grown at a growth temperature of greater than 500° C.

11. The method of claim 1, wherein the Group III-nitride epilayer is grown at a growth temperature of less than 1085° C.

* * * * *